United States Patent [19]
Fujii

[11] Patent Number: 6,008,588
[45] Date of Patent: Dec. 28, 1999

[54] ORGANIC ELECTROLUMINESCENT DEVICE DRIVING METHOD, ORGANIC ELECTROLUMINESCENT APPARATUS AND DISPLAY DEVICE

[75] Inventor: Hiroyuki Fujii, Moriguchi, Japan

[73] Assignee: Sanyo Electric Co., Ltd., Moriguchi, Japan

[21] Appl. No.: 08/969,658

[22] Filed: Nov. 13, 1997

[30] Foreign Application Priority Data

Nov. 15, 1996 [JP] Japan .................................... 8-304886
Oct. 8, 1997 [JP] Japan .................................... 9-275454

[51] Int. Cl.$^6$ ................................................. G09G 3/10
[52] U.S. Cl. .................................... 315/169.3; 315/169.1; 313/4.98; 313/504
[58] Field of Search ........................... 315/169.3, 169.1; 313/498, 504, 506; 345/76, 92

[56] References Cited

U.S. PATENT DOCUMENTS

| | | | |
|---|---|---|---|
| 5,216,331 | 6/1993 | Hosokawa et al. | 315/169.3 |
| 5,456,988 | 10/1995 | Sano et al. | 428/690 |
| 5,684,365 | 11/1997 | Tang et al. | 315/169.3 |
| 5,693,428 | 12/1997 | Fujii et al. | 313/504 X |

FOREIGN PATENT DOCUMENTS

| | | |
|---|---|---|
| 0 365 445 | 10/1989 | European Pat. Off. . |
| 2-148687 | 6/1990 | Japan . |
| 4-125683 | 4/1992 | Japan . |
| 8-54835 | 2/1996 | Japan . |
| 8-54836 | 2/1996 | Japan . |
| 8-161986 | 6/1996 | Japan . |
| 8-162705 | 6/1996 | Japan . |
| 9-82472 | 3/1997 | Japan . |
| WO 96/26830 | 9/1996 | WIPO . |

OTHER PUBLICATIONS

American Institute of Physics, Aug. 5, 1996 "Three–Layered Multicolor Organic Electroluminescent Device", Yoshida, M., et al.

*Primary Examiner*—Haissa Philogene
*Attorney, Agent, or Firm*—Armstrong, Westerman, Hattori, McLeland & Naughton

[57] ABSTRACT

In causing an organic electroluminescent device to emit light upon exerting a voltage between a hole injection electrode and an electron injection electrode in the organic electroluminescent device, the frequency of electricity supplied to the organic electroluminescent device is modulated, to adjust the luminance of the light emitted from the organic electroluminescent device. In an organic electroluminescent apparatus and a display device in which the organic electroluminescent device is provided, there is provided frequency modulation means for modulating the frequency of electricity and supplying electricity to the organic electroluminescent device.

21 Claims, 9 Drawing Sheets

ORGANIC ELECTROLUMINESCENT DEVICE DRIVING METHOD, ORGANIC ELECTROLUMINESCENT APPARATUS AND DISPLAY DEVICE

BACKGROUND OF THE INVENTION

1. Field of the Invention

The present invention relates generally to an organic electroluminescent device driving method in which an organic electroluminescent device is caused to emit light upon supplying electricity between a hole injection electrode and an electron injection electrode in the organic eletroluminescent device, an organic electroluminescent apparatus using such an organic electroluminescent device driving method, and a display device in which a plurality of organic electroluminescent devices are provided. More particularly, the present invention relates to an organic electroluminescent device driving method in which the luminance of light emitted from an organic electroluminescent device can be simply adjusted, and an organic electroluminescent apparatus utilizing such an organic electroluminescent device driving method, and a display device.

2. Description of the Related Art

In recent years, the needs of flat panel display devices, the consumed power and the size of which are less than those of a CRT (Cathode-Ray Tube), which has been conventionally generally employed, have been increased as information equipments are diversified, for example, whereby an electroluminescent device has been paid attention to as one of the flat panel display devices.

The electroluminescent device is roughly divided into an inorganic electroluminescent device and an organic electroluminescent device depending on the material used.

The inorganic electroluminescent device is sued adapted that a high density electric field is generally exerted on a luminescent portion, and electrons are accelerated within the high density electric field to collide with a luminescence center, whereby the luminescence center is excited to emit light. On the other hand, the organic electroluminescent device is such adapted that electrons and holes are respectively injected into a luminescent portion from an electron injection electrode and a hole injection electrode, the electrons and the holes thus injected are recombined with each other in a luminescence center to bring an organic molecule into its excited state, and the organic molecule emits fluorescence when it is returned from the excited state to its ground state.

In the case of the inorganic electroluminescent device, a high voltage of 100 to 200 volts is required as its driving voltage because a high density electric field is exerted, as described above. On the other hand, the organic electroluminescent device can be driven at a low voltage of approximately 5 to 20 volts.

In the case of the organic electroluminescent device, a light emitting device emitting light in a suitable color can be obtained by selecting a fluorescent material which is a luminescent material. It is expected that the organic electroluminescent device can be also utilized as a multi-color or full-color display device or the like. Further, the organic electroluminescent device can emit light at a low voltage. In recent years, therefore, various studies have been conducted on such an organic electroluminescent device.

Developed as the organic electroluminescent device are ones having a three-layer structure which is referred to as a DH structure in which a hole transporting layer, a luminescent layer and an electron transporting layer are laminated between a hole injection electrode and an electron injection electrode, a two-layer structure which is referred to as an SH-A structure in which a hole transporting layer and a luminescent layer abundant in electron transporting characteristics are laminated between a hole injection electrode and an electron injection electrode, and a two-layer structure which is referred to as an SH-B structure in which a luminescent layer abundant in hole transporting characteristics and an electron transporting layer are laminated between the hole injection electrode and the electron injection electrode.

In recent years, the above-mentioned organic electroluminescent device has been utilized for a display or the like. Therefore, a method of adjusting the luminance of light emitted from the organic electroluminescent device has been examined in causing the organic electroluminescent device to emit light upon supplying electricity, i.e., exerting a voltage, between a hole injection electrode and an electron injection electrode in the organic electroluminescent device.

Examples of a method of adjusting the luminance of light emitted from the organic electroluminescent device include a method of changing a voltage exerted between an electron injection electrode and a hole injection electrode in the organic electroluminescent device, and a method of changing the duty ratio of a voltage applied to the organic electroluminescent device, as disclosed in Japanese Patent Laid-Open No. 54835/1996.

When the voltage applied to the organic electroluminescent device is changed to adjust the luminance of light emitted from the organic electroluminescent device, however, the change in the luminance with the change in the voltage becomes non-linear, whereby the luminance of the light emitted from the organic electroluminescent device cannot be suitably adjusted. In a display device such as a display in which a lot of organic electroluminescent devices are arranged in a matrix, the gray level characteristics are degraded, for example.

In the above-mentioned display device, when the voltage applied to the organic electroluminescent device is changed to adjust the luminance of the light emitted from the organic electroluminescent device, voltage drop caused by a resistance component of a wiring portion changes depending on a current flowing through the wiring portion. Thus, the voltage drop is also affected by the voltage applied to the organic electroluminescent device. When the luminance in a certain organic electroluminescent device is changed, therefore, the luminance in the other organic electroluminescent device is also changed.

On the other hand, when the duty ratio of the voltage applied to the organic elctroluminescent device is changed to adjust the luminance of the light emitted from the organic electroluminescent device, the change in the luminance of the light with the change in the duty ratio becomes approximately linear, whereby the luminance of the light emitted from the organic electroluminescent device can be suitably adjusted.

When the duty ratio of the voltage exerted on the organic elctroluminescent device is changed, however, pulse width modulating circuits having a large current-flowing capacity must be provided ahead of and behind the organic electroluminescent device. In a display device such as a display in which a lot of organic electroluminescent devices are arranged in a matrix, the device becomes complicated, for example.

Furthermore, when the duty ratio of the voltage of electricity supplied to the organic electroluminescent device is thus changed, the pulse width is widened as the duty ratio increases. Consequently, the root mean square value of the current of electricity, i.e., the effective value of the current also increases. When the average value of the current in a predetermined time period thus increases, the average value of the voltage drop caused by the resistance component of the wiring portion also increases as the duty ratio increases.

Even in such a case, therefore, when the luminance in a certain organic electroluminescent device is changed, the luminance in the other organic electroluminescent device is also changed, as in a case where the voltage is changed as described above.

SUMMARY OF THE INVENTION

An object of the present invention is to make it possible to adjust, in causing an organic electroluminescent device to emit light upon supplying electricity between a hole injection electrode and an electron injection electrode in the organic electroluminescent device, the luminance of the light emitted from the organic elecroluminescent device simply and suitably.

Another object of the present invention is to make it possible to achieve superior gray level representation in an organic electroluminescent apparatus and a display device using an organic electroluminescent device.

Still another object of the present invention is to simplify a display device using an organic electroluminescent device.

A further object of the present invention is to make it possible to accurately control, in a display device using organic electroluminescent devices, the luminance of each of pixels composing an image upon preventing, when the luminance in a certain organic electroluminescent device is changed, the luminance in the other organic electroluminescent device from being changed.

In an organic electroluminescent device driving method according to the present invention, in causing an organic electroluminescent device to emit light upon supplying electricity between a hole injection electrode and an electron injection electrode in the organic electroluminescent device, a frequency of electricity supplied to the organic electroluminescent device is modulated, to adjust a luminance of the light emitted from the organic electroluminescent device.

When the frequency of electricity supplied between the hole injection electrode and the electron injection electrode in the organic electroluminescent device is thus modulated, the luminance of the light emitted from the organic electroluminescent device decreases as the frequency increases, and the change in the luminance becomes linear with respect to the logarithm of the frequency. Therefore, the luminance of the light emitted from the organic electroluminescent device is suitably adjusted.

In modulating the frequency to adjust the luminance of the light emitted from the organic electroluminescent device, when the frequency of electricity supplied to the organic electroluminescent device is modulated in the range of 1 kHz to 300 kHz, the change in the luminance generally becomes linear with respect to the logarithm of the frequency. Therefore, the luminance of the light emitted from the organic electroluminescent device is suitably adjusted depending on the logarithm of the frequency.

The frequency of electricity supplied to the organic electroluminescent device can be thus modulated more simply, as compared with that in a case where the duty ratio of the voltage applied to the organic electroluminescent device is changed. Therefore, the device is not complicated.

As the organic electroluminescent device in the present invention, a conventionally known organic electroluminescent device can be used. Any of the above-mentioned DH structure, SH-A structure, and SH-B structure may be used. An indium-tin oxide (ITO) or the like having a large work function is preferably used as the hole injection electrode in the organic electroluminescent device in order that holes are efficiently injected. On the other hand, a magnesium-indium alloy, a lithium-aluminum alloy or the like having a small work function is preferably used as the electron injection electrode in order that electrons are efficiently injected.

In an organic electroluminescent apparatus according to the present invention, there is provided frequency modulation means for modulating the frequency of electricity and supplying electricity to an organic electroluminescent device.

In the organic electroluminescent apparatus, when the frequency of electricity is modulated and electricity is applied to the organic electroluminescent device from the frequency modulation means, the change in the luminance in the organic electroluminescent device becomes linear with respect to the logarithm of the frequency of electricity supplied to the organic electroluminescent device, so that the luminance of the light emitted from the organic electroluminescent device can be suitably adjusted.

In a display device in which a plurality of organic electroluminescent devices are provided, a first display device according to the present invention is characterized in that there is provided frequency modulation means for modulating the frequency of electricity and supplying electricity to the organic electroluminescent devices.

If frequency modulation means for modulating the frequency of electricity and supplying electricity to organic electroluminescent devices is provided, to modulate the frequency of electricity and supply electricity to each of the organic electroluminescent devices from frequency modulation means as in the display device, the organic electroluminescent device emits light with suitable luminance corresponding to the logarithm of the frequency of electricity supplied to the organic electroluminescent device, so that a display device superior in gray level representation is obtained.

In a display device in which organic electroluminescent devices are arranged in a matrix, a second display device according to the present invention is characterized in that there is provided for each of columns or rows of the organic electroluminescent devices arranged in a matrix frequency modulation means for modulating the frequency of electricity and supplying electricity to the organic electroluminescent devices.

In the second display device, the frequency of electricity supplied from the frequency modulation means is modulated in units of the columns or the rows of the organic electroluminescent devices to perform scanning. Consequently, an emission time during which each of the organic electroluminescent devices is caused to emit light upon application of electricity to the organic electroluminescent device can be made longer, as compared with that in a case where the organic electroluminescent devices are caused to emit light upon modulating the frequency of electricity supplied to the organic electroluminescent devices by one frequency modulation means.

When the emission time during which each of the organic electroluminescent devices is caused to emit light thus becomes long, the voltage applied to the organic electroluminescent device can be decreased. Therefore, the organic electroluminescent device can be driven in a region at a voltage where light emission efficiency is high in the organic electroluminescent device. As a result, in the second display device, small consumed power is sufficient, and an image which is bright and does not flicker can be represented.

In a display device in which organic electroluminescent devices are arranged in a matrix, a third display device according to the present invention is characterized in that there are provided for each of the organic electroluminescent devices arranged in a matrix frequency modulation means for modulating the frequency of electricity and supplying electricity to the organic electroluminescent device and storage means for storing data representing the frequency of supplied electricity.

If the frequency modulation means for modulating the frequency of electricity and supplying electricity and the storage means for storing data representing the frequency of supplied electricity are provided for each of organic electroluminescent devices arranged in a matrix as in the third display device, electricity having a predetermined frequency continues to be applied to the organic electroluminescent device from the frequency modulation means on the basis of the data representing the frequency stored in the storage means, so that an emission time during which each of the organic electroluminescent devices emits light can be made longer than that in the above-mentioned second display device.

In the third display device, therefore, the voltage applied to each of the organic electroluminescent devices can be further decreased. Therefore, the organic electroluminescent device can be driven in a region at a voltage where light emission efficiency is high in the organic electroluminescent device. As a result, smaller consumed power is sufficient, and an image which is bright and does not flicker can be represented.

In the above-mentioned first to third display devices, when the frequency of electricity supplied to each of the organic electroluminescent devices is modulated in the range of 1 kHz to 300 kHz by the frequency modulation means, the change in the luminance in the organic electroluminescent device becomes linear with respect to the logarithm of the frequency of supplied electricity. The luminance of the light emitted from the organic electroluminescent device is suitably adjusted, so that superior gray level representation can be achieved.

In each of the above-mentioned second and third display devices, when a counter circuit or a frequency demultiplier is used as the above-mentioned frequency modulation means, the construction of the display device is simplified. Further, in the third display device, when a capacitor is used as the above-mentioned storage means, the construction of the display device is further simplified.

In each of the above-mentioned first to third display devices, in modulating the frequency of electricity supplied to each of the organic electroluminescent devices from the frequency modulation means, consider a case where the root mean square value of the current of electricity, i.e. the effective value of the current, supplied to the organic electroluminescent device is made constant to increase or decrease the frequency of electricity. In this case, even when the luminance in a certain electroluminescent device is changed, the luminance in the other organic electrolumninescent device is not changed.

The conventional display device in which the duty ratio of the voltage applied to the organic electroluminescent device is changed to change the luminance in the organic electroluminescent device as described above and the display device according to the present invention in which the effective value of electricity supplied to each of organic electroluminescent devices is made constant to increase or decrease the frequency of electricity as described above will be compared with each other.

In the conventional display device in which the duty ratio of the voltage applied to the organic electroluminescent device is changed to adjust the luminance, the pulse width of a pulse in one pulse respective period is increased or decreased in a state where the pulse repetition period is constant. The luminance in the organic electroluminescent device is so changed that the pulse width is widened when the luminance in the organic electroluminescent device is increased, while being narrowed when the luminance in the organic electroluminescent device is decreased.

In the case of the conventional display device, therefore, the pulse width of the voltage pulse in one repetition period is changed, so that the effective value of the current flowing through the organic electroluminescent device changes.

On the other hand, in the display device according to the present invention in which the frequency of electricity supplied to each of the organic electroluminescent devices is modulated from the frequency modulation means, the length of one period changes with the change in the pulse width of the pulse, so that the frequency is changed. Therefore, the effective value of the current flowing through the organic electroluminescent device is kept constant.

In the display device according to the present invention, therefore, even when the pulse width of the pulse is changed to change the luminance in a certain electroluminescent device, voltage drop caused by the resistance component of the wiring portion does not change. As a result, when the luminance in a certain electroluminescent device is changed, the luminance in the other organic electroluminescent device is not changed. Therefore, the luminance of each of pixels composing an image can be accurately controlled.

Although in the present invention, the waveform of an arbitrary wave such as a sine wave, a distorted wave, square wave, or a triangular wave can be used as the waveform of electricity supplied to the organic electroluminescent device, the effective value of the current flowing through the organic electroluminescent device is kept constant as described above.

There and other objects, advantages and features of the invention will become apparent from the following description thereof taken in conjunction with the accompanying drawings which illustrate specific embodiment of the invention.

DESCRIPTION OF THE PREFERRED EMBODIMENTS

An organic electroluminescent device driving method according to the present invention and a display device using such an organic electroluminescent device driving method will be specifically described in accordance with embodiments.

(Embodiment 1)

Figure 1:
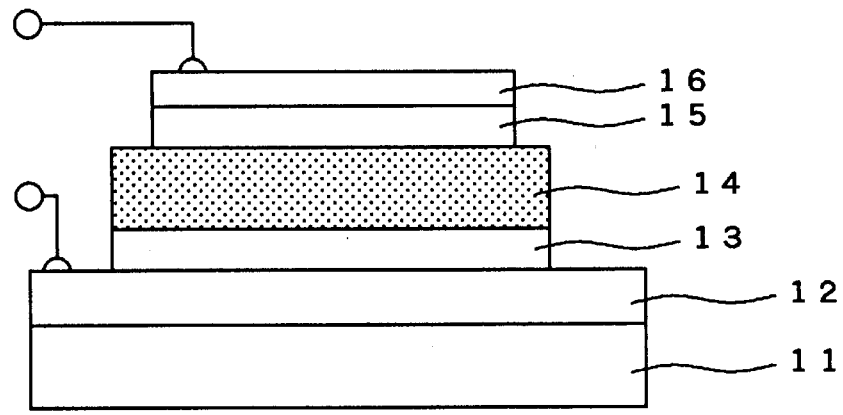
FIG. 1 is a schematic explanatory view showing the structure of an organic electroluminescent device used in an organic electroluminescent device driving method according to an embodiment 1 of the present invention.

In the present embodiment, an example of an organic electroluminescent device is one having the above-mentioned DH structure by successively forming on a glass substrate 11 a hole injection electrode 12 having a thickness of 100 nm (ranging from 80 nm to 200 nm) which is composed of the above-mentioned ITO, a hole transporting layer 13 having a thickness of 70 nm (ranging from 60 nm to 70 nm) which is composed of a triphenylamine derivative (MTDATA) indicated by the following chemical formula 1, a luminescent layer 14 having a thickness of 20 nm in which 5% by weight of 5,6,11,12-tetraphenylnaphthacene (rubrene) indicated by the following chemical formula 3 is doped into a host material composed of N,N'-diphenyl-N, N'-bis(3-methylphenyl)-1,1-biphenyl-4,4'-diamine (TPD) indicated by the following chemical formula 2, an electron transporting layer 15 having a thickness of 60 nm (ranging from 40 nm to 60 nm) which is composed of a bis(10-hydroxybenzo[h]quinolinate) beryllium complex ($BeBq_2$) indicated by the following chemical formula 4, and an electron injection electrode 16 having a thickness of 200 nm which is composed of a magnesium-indium alloy, which contains 90% by weight of magnesium and 10% by weight of indium, as shown in FIG. 1.

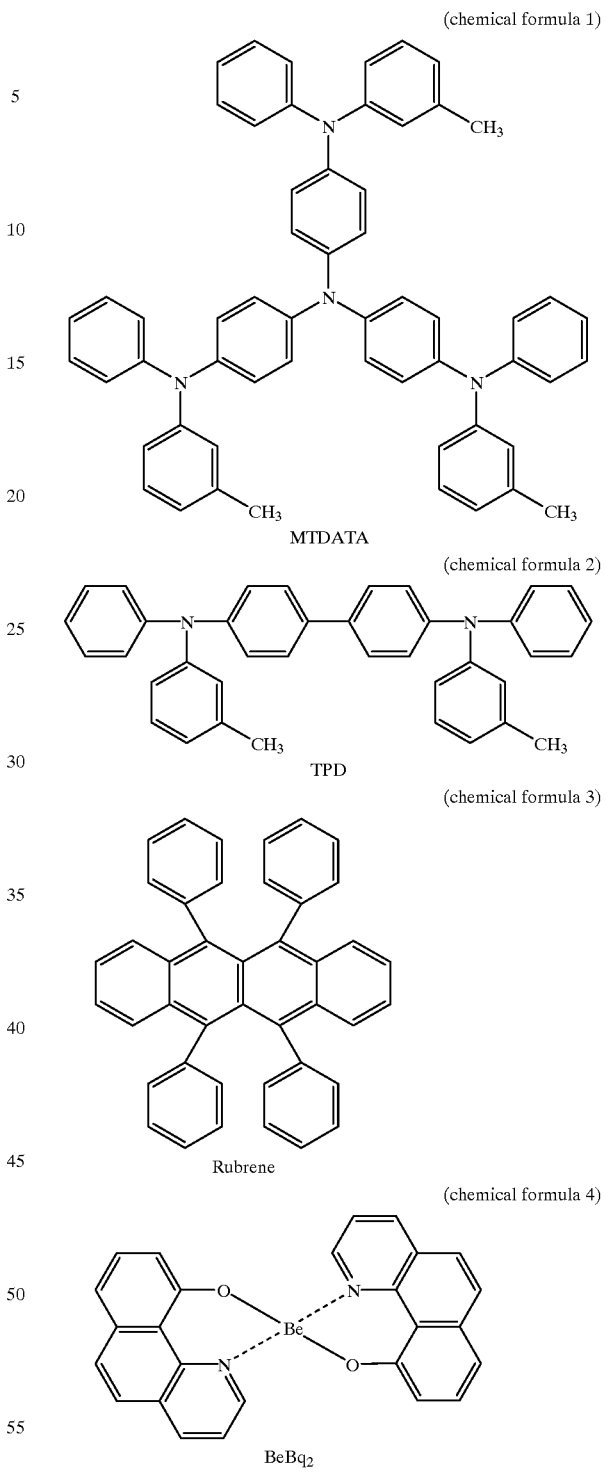

(chemical formula 1) MTDATA (chemical formula 2) TPD (chemical formula 3) Rubrene (chemical formula 4) $BeBq_2$ In the present embodiment, in causing the organic electroluminescent device to emit light upon supplying electricity between the hole injection electrode 12 and the electron injection electrode 16, the frequency of supplied electricity was modulated, to adjust the luminance of the light emitted from the organic electroluminescent device.

Experiments for examining the change in the luminance of the light emitted from the organic electroluminescent device upon changing the type of electricity supplied to the organic electroluminescent device were conducted.

(Experimental Example 1)

Figure 2:
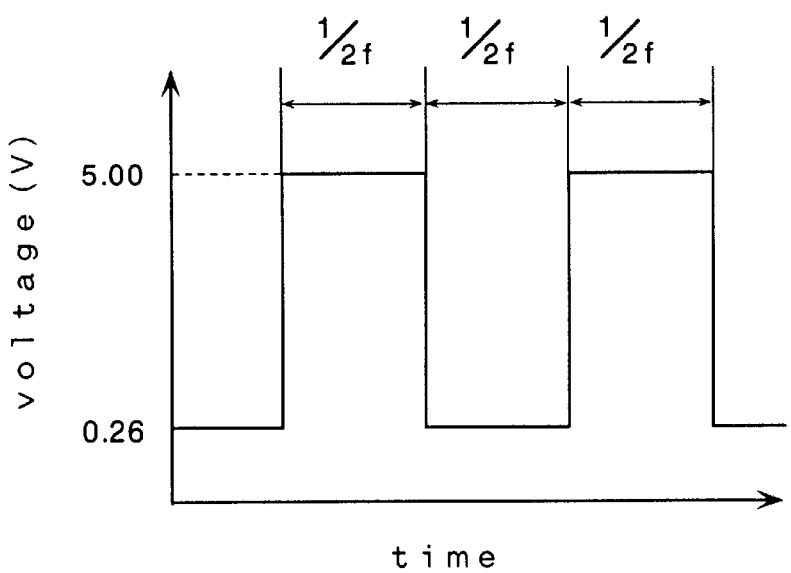
FIG. 2 is a diagram showing the waveform of a voltage applied to an organic electroluminescent device in an experimental example 1.

In the experimental example 1, electricity having a maximum voltage of 5.00 volts and a minimum voltage of 0.26 volts which is composed of a square wave with a duty ratio of 50% was supplied, as shown in FIG. 2, as electricity supplied to the organic electroluminescent device, and the frequency f of electricity was changed, to measure the luminance of the light emitted from the organic electroluminescent device. The results were shown in FIG. 3.

(Experimental Example 2)

Figure 4:
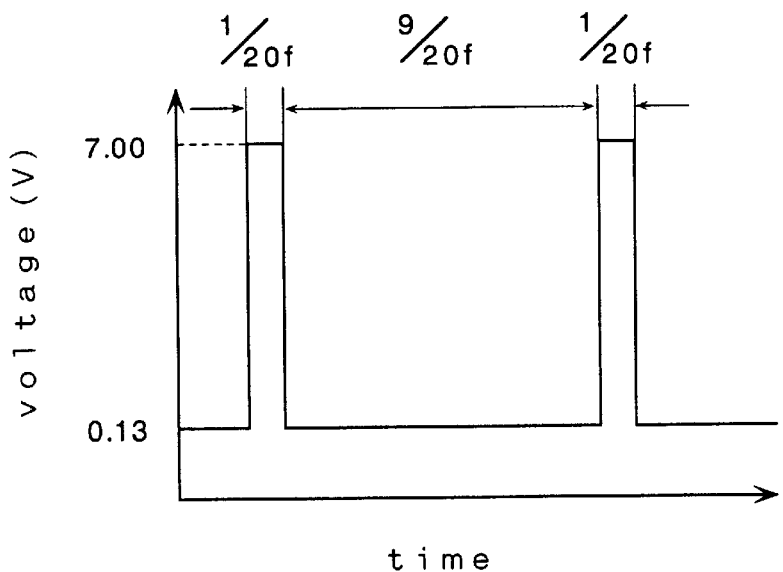
FIG. 4 is a diagram showing the waveform of a voltage applied to an organic electroluminescent device in an experimental example 2.

In the experimental example 2, electricity having a maximum voltage of 7.00 volts and a minimum voltage of 0.13 volts which is composed of a square wave with a duty ratio of 5% was supplied, as shown in FIG. 4, as electricity supplied to the organic electroluminescent device, and the frequency f of electricity was changed, to measure the luminance of the light emitted from the organic electroluminescent device. The results were shown in FIG. 5.

(Experimental Example 3)

Figure 6:
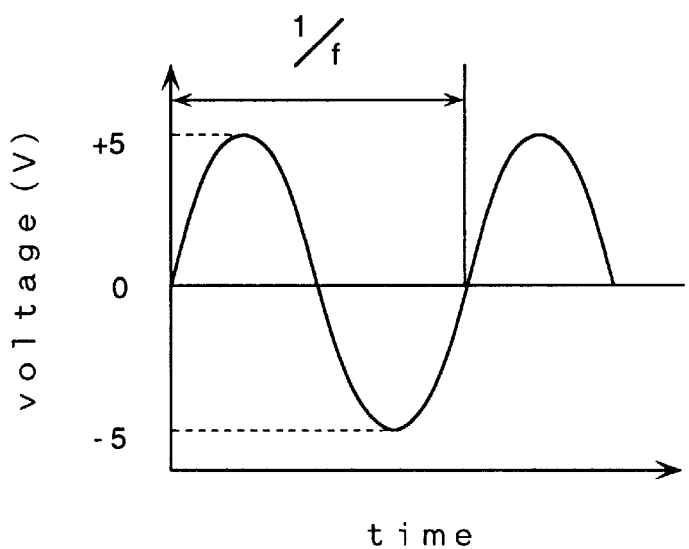
FIG. 6 is a diagram showing the waveform of a voltage applied to an organic electroluminescent device in an experimental example 3.

In the experimental example 3, electricity such as an alternative current, having a maximum voltage of 5 volts and a minimum voltage of −5 volts which is composed of a sine wave was supplied, as shown in FIG. 6, as electricity supplied to the organic electroluminescent device, and the frequency f of electricity was changed, to measure the luminance of the light emitted from the organic electroluminescent device. The results were shown in FIG. 7.

As can be seen from the results of the experiments, in a portion where the frequency of electricity supplied to the organic electroluminescent device is 1 kHz to 300 kHz, the luminance of the light emitted from the organic electroluminescent device linearly decreases with respect to the logarithm of the frequency as the frequency increases. Light having suitable luminance was obtained from the organic electroluminescent device by suitably adjusting the frequency of electricity supplied in the range of 1 kHz to 300 kHz.

The relationship between the frequency of electricity supplied to the organic electroluminescent device and the luminance varies depending on the structure of the organic electroluminescent device and a material used. In all types of organic electroluminescent devices on which experiments were conducted by the inventors of the present application, the simular results as those in the above-mentioned experimental examples were obtained. That is, the luminance of the light emitted from the organic electroluminescent device linearly decreased with respect to the logarithm of the frequency.

In a frequency range in which the luminance of the light emitted from the organic electroluminescent device linearly changes with respect to the logarithm of the frequency, the upper limit of the frequency range and the lower limit of the frequency range are then respectively taken as the maximum frequency and the minimum frequency. In this case, the relationship between the maximum and minimum frequencies and the structure of the organic electroluminescent device and the used material was examined. At the present time point, the following relationships (1) to (5) are expected:

(1) The smaller the thickness of an organic layer is, the higher the maximum and minimum frequency are. The organic layer comprises the hole transporting layer 13, the luminescent layer 14, the electron transporting layer 15 and the like which are formed between the hole injection electrode 12 and the electron injection electrode 16.

(2) The larger the carrier mobility of a material composing the organic layer is, the higher the maximum and minimum frequencies are.

(3) The higher the probability that electrons and holes are recombined with each other in the organic layer is, the higher the maximum and minimum frequencies are.

(4) The larger the fluorescent quantum yield is, the higher the maximum and minimum frequencies are. The fluorescent quantum yield represents the probability that the excited state of an organic molecule produced in the organic layer is returned to a ground state by emission of fluorescence.

(5) Even if the structure of the organic electroluminescent device and the material used for the organic layer are changed, the ratio of the maximum frequency to the minimum frequency is generally in the range of 100 to 300.

(Embodiment 2)

Figure 8:
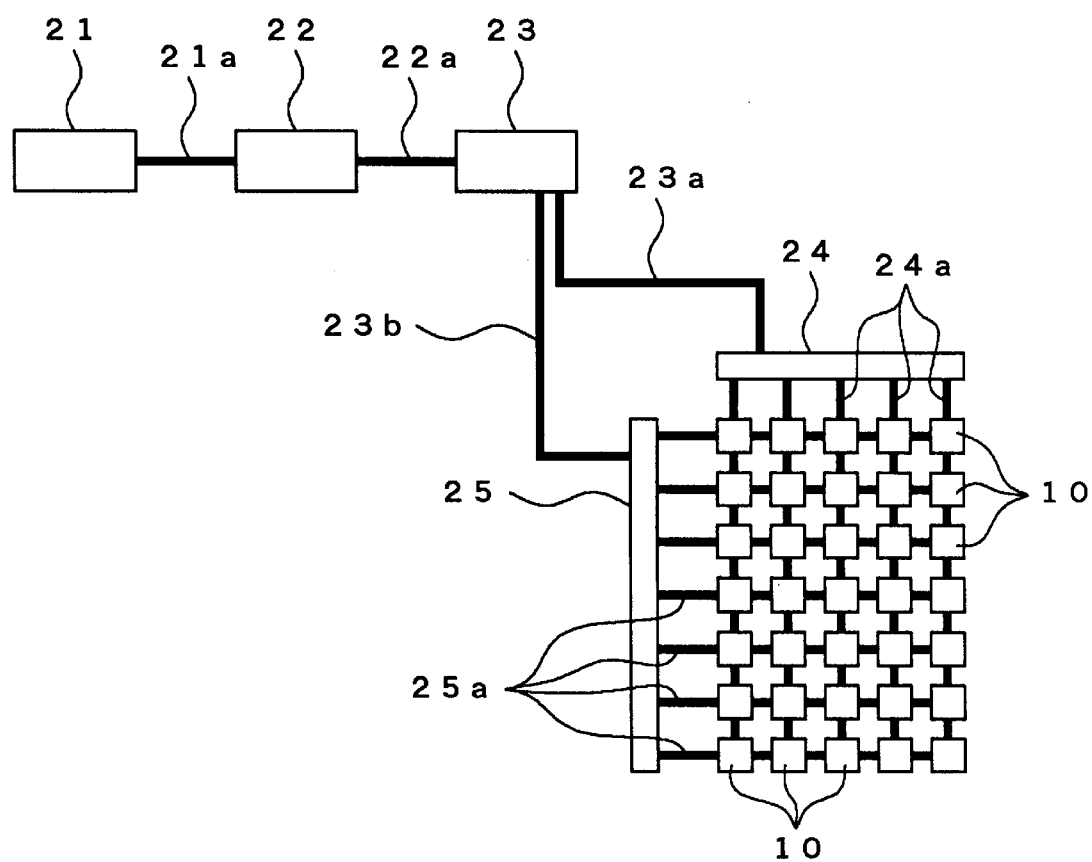
FIG. 8 is a schematic explanatory view of a display device according to an embodiment 2 utilizing the organic electroluminescent device driving method according to the embodiment of the present invention.

In the present embodiment, a display device in which a plurality of organic electroluminescent devices 10 are arranged in a matrix will be specifically described, as shown in FIG. 8.

In the display device according to the present embodiment, an image signal is transmitted to a frequency modulator 22 through an image information transmission line 21a such as a digital parallel signal bus-line from an image information generator 21 composed of a digital memory device storing information representing the luminance of each of pixels composing an image, as shown in FIG. 8.

In the frequency modulator 22, an FM signal composed of a sine wave, a square wave, a triangular wave, or the like whose frequency is modulated depending on the image information transmitted by the image information transmission line 21a.

Figure 3:
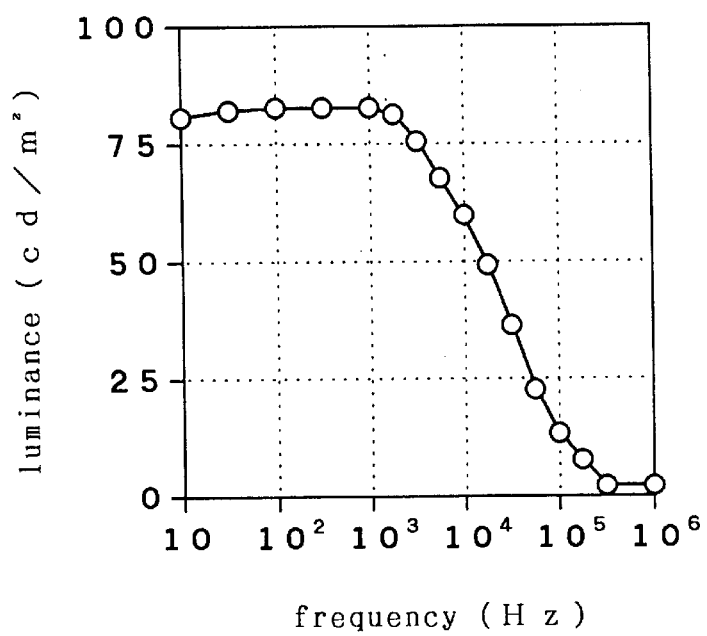
FIG. 3 is a diagram showing the relationship between the frequency of electricity supplied to the organic electroluminescent device and the luminance of light emitted from the organic electroluminescent device in the experimental example 1.
Figure 5:
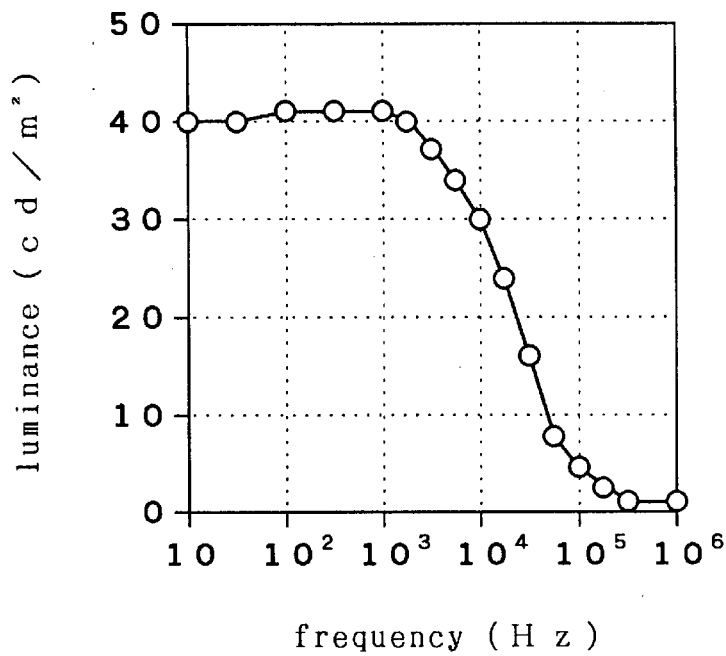
FIG. 5 is a diagram showing the relationship between the frequency of electricity supplied to the organic electroluminescent device and the luminance of light emitted from the organic electroluminescent device in the experimental example 2.
Figure 7:
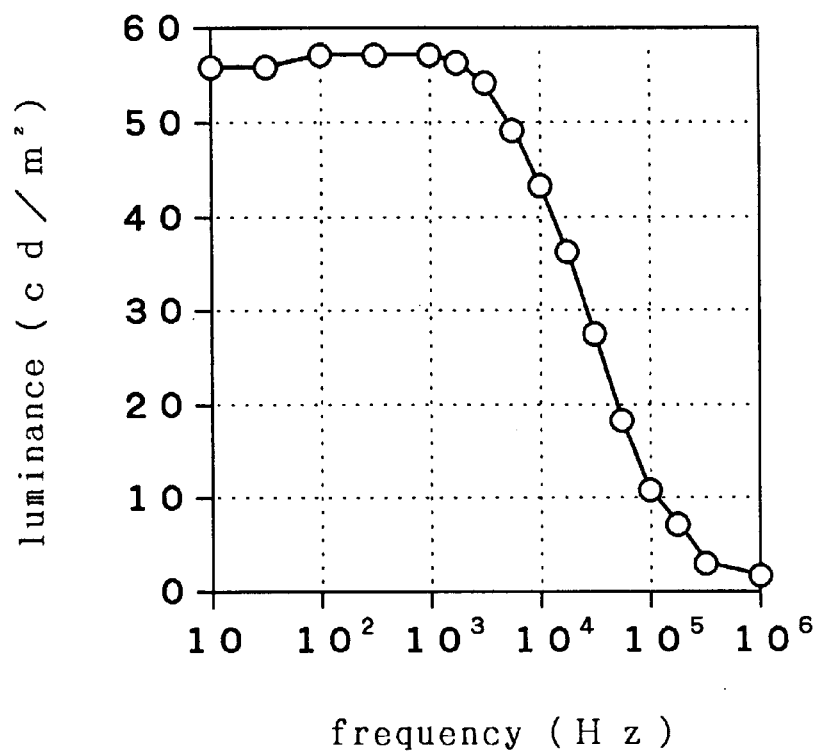
FIG. 7 is a diagram showing the relationship between the frequency of electricity supplied to the organic electroluminescent device and the luminance of light emitted from the organic electroluminescent device in the experimental example 3.

In the case of a pixel displayed most brightly, the frequency of the FM signal generated in the frequency modulator 22 is set to a frequency of not more than 1 kHz at which the luminance in the organic electroluminescent device is high, as shown in FIGS. 3, 5 and 7. On the other hand, in the case of the pixel displayed darkly, the frequency of the FM signal is set to a suitable frequency corresponding to the luminance of the pixel in the range of 1 kHz to 300 kHz.

The FM signal whose frequency is modulated as described above is then transmitted to a broadband amplifier 23 through an FM signal transmission line 22a from the frequency modulator 22. The voltage amplitude of the FM signal transmitted in the FM signal transmission line 22a is set to approximately several millivolts to 5 volts, for example.

In the broadband amplifier 23, the FM signal transmitted as described above is amplified and is outputted with output impedance lowered. The voltage amplitude of the FM signal, which is outputted by the broadband amplifier 23, is set to approximately 3 to 15 volts.

The FM signal outputted from the broadband amplifier 23 is then transmitted to a horizontal scanning circuit 24 and a vertical scanning circuit 25, respectively, through output wirings 23a and 23b.

In the horizontal scanning circuit 24, a plurality of longitudinal wirings 24a are scanned upon being successively selected one at a time, to output the FM signal transmitted by the output wiring 23a. On the other hand, in the vertical scanning circuit 25, a plurality of transverse wirings 25a are scanned upon being successively selected one at a time, to output the FM signal transmitted by the output wiring 23b. The wirings are scanned 300 times per second, for example, in the horizontal scanning circuit 24, while the wirings are scanned 60 times per second, for example, in the vertical scanning circuit 25.

The FM signal is exerted on each of the organic electroluminescent devices 10 upon scanning the wirings in the horizontal scanning circuit 24 and the vertical scanning circuit 25, to adjust the luminance in each of the organic electroluminescent devices 10. In this case, the timing of output of the image signal from the image information generator 21 and scanning in the horizontal scanning circuit 24 and the vertical scanning circuit 25 is adjusted by timing control means (not shown).

Consequently, the relative luminance of each of the organic electroluminescent devices can be controlled by the frequency modulator 22, and the average luminance in the entire display device can be adjusted by changing the amplification factor of the broadband amplifier 23 to change the voltage amplitude of the FM signal.

In the display device according to the present embodiment, therefore, the average luminance of the display device is adjusted depending on the illuminance in a place where the display device is used without complicating the display device, so that an image can be easily seen, and an image superior in gray level characteristics is displayed.

(Embodiment 3)

Figure 9:
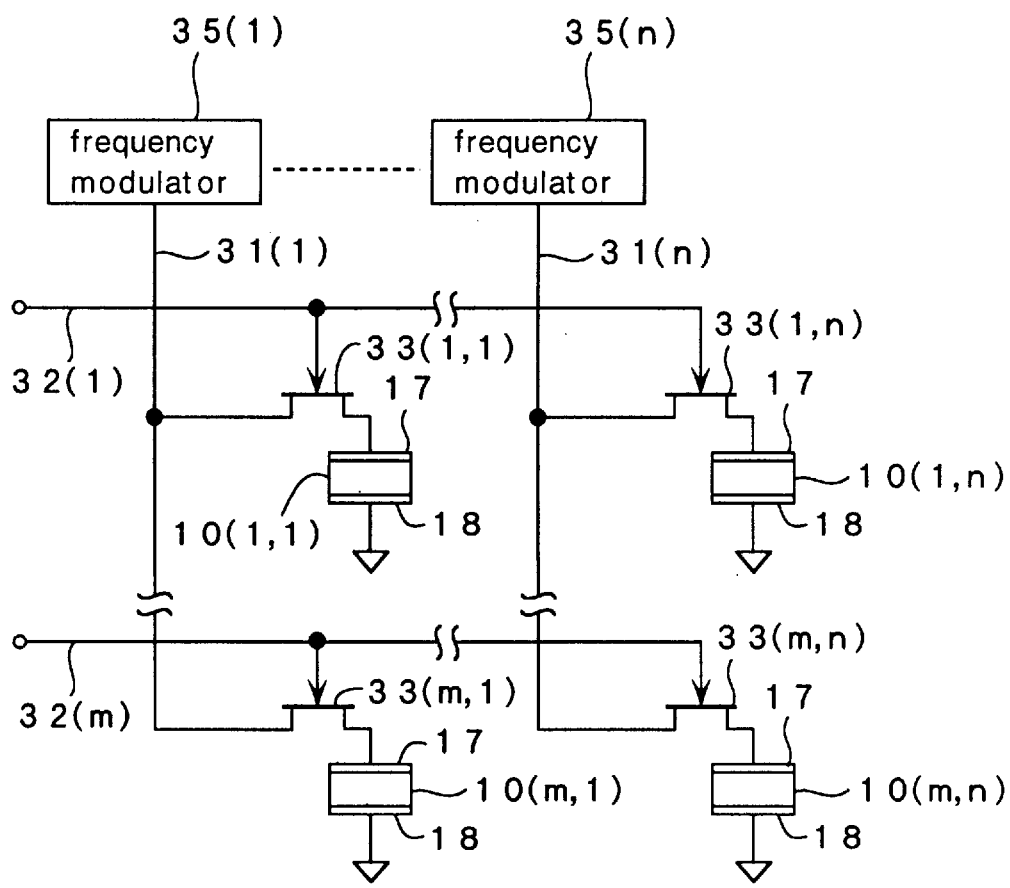
FIG. 9 is a schematic explanatory view of a display device according to an embodiment 3 utilizing the organic electroluminescent device driving method according to the embodiment of the present invention.

In the present embodiment, a display device in which organic electroluminescent devices 10 are arranged in a matrix with n columns and m rows, as shown in FIG. 9, will be specifically described, where n and m are arbitrary natural numbers.

In the display device according to the present embodiment, n data lines 31 for respectively feeding electric signals for driving the organic electroluminescent devices 10 arranged in a matrix with n columns and m rows are provided in correspondence to the columns of the organic electroluminescent devices 10, and m scanning lines 32 for respectively selecting pixels are provided in correspondence to the rows of the organic electroluminescent devices 10 in such a manner as to be perpendicular to the n data lines 31, as shown in FIG. 9.

Switching elements 33 are respectively provided in correspondence to the organic electroluminescent devices 10 in intersections of the data lines 31 and the scanning lines 32. The switching elements 33 are respectively connected to pixel electrodes 17 constituting one electrodes of the organic electroluminescent devices 10, while the other electrodes in the organic electroluminescent devices 10 are a common electrode 18.

Furthermore, n frequency modulators 35 for outputting an electric signal whose frequency is modulated are respectively provided in correspondence to the data lines 31, and the frequency modulators 35 are respectively connected to the corresponding data lines 31.

In the display device, the scanning lines 32 in the first row to the m-th row are successively selected and are made active, and only the switching elements 33 connected to the scanning lines 32 in the rows which are selected and are made active are turned on.

On the other hand, to each of the organic electroluminescent devices 10 in the first column to the n-th column which are connected to the rows of the switching elements 33 thus turned on, an electric signal whose frequency is modulated depending on the luminance in the organic electroluminescent device 10 is fed from corresponding one of the frequency modulators 35 in the first column to the n-th column through the corresponding data line 31.

An arbitrary column between the first column and the n-th column is indicated as the (i)-th column, an arbitrary row between the first row and the m-th row is indicated as the (j)-th row, and a position in the (i)-th column and the (j)-th row is indicated as (j,i). In this case, when the scanning line 32(j) in the j-th row is selected and is made active, only the switching elements 33(j,i) to 33(j,n) in the j-th row which are connected to the scanning line 32(j) in the j-th row are turned on.

To each of the organic electroluminescent devices 10(j,i) to 10(j,n) in the j-th row which are connected to the switching elements 33(j,i) to 33(j,n) in the j-th row which are thus turned on, an electric signal whose frequency is modulated depending on the luminance in the organic electroluminescent device is fed from corresponding one of the frequency modulators 35(l) to 35(n) in the first column to n-th column through corresponding one of the data lines 31(l) to 31(n).

Consequently, the organic electroluminescent devices 10(j,i) to 10(j,n) provided in the j-th row simultaneously emit light, each of them emitting light with predetermined luminance.

The luminance in each of all the organic electoluminescent devices 10(1,1) to (m,n) in the display device is controlled by successively selecting the scanning lines 32 in the first row to the m-th row and making the selected scanning lines 32 active. Therefore, he an image superior in gray level characteristics is displayed on the entire display device by performing the scanning m times.

In the above-mentioned display device, an emission time Te is a period during which one of the organic electroluminescent devices 10 emits light. A scanning period Tf is a period in which the scanning lines 32 in the first row to the m-th row are scanned upon being successively selected. An integer m is a number of the scanning line 32. The emission time Te becomes the scanning period Tf divided by the integer m, i.e., Te= (Tf/m). Therefore, the emission time Te during which each of the organic electroluminescent devices 10 emits light can be made longer, as compared with that in a case where the organic electroluminescent devices 10 are successively selected to emit light upon performing scanning in the horizontal scanning circuit 24 and the vertical scanning circuit 25 as in the display device according to the above-mentioned embodiment 2.

In a case where the number of columns n and the number of rows m of the organic electroluminescent devices 10 arranged in a matrix as described above are respectively taken as 128 and 64, it is preferable that the scanning period Tf is set to not more than 1/30 seconds in order to restrain the flickering of an image. When the scanning period Tf is set to 33 msec, the emission time Te during which each of the organic electroluminescent devices 10 emits light is 0.52 msec.

In the display device according to the present embodiment, therefore, a voltage applied to each of the organic electroluminescent devices 10 can be decreased, and the organic electroluminescent device 10 can be driven in a region at a low voltage where light emission efficiency is high. Therefore, small consumed power is sufficient, and an image which is bright and does not flicker can be represented.

In the above-mentioned display device, in adjusting the luminance in each of the organic electroluminescent devices 10, it is possible to use a look-up table system in which the relationship between the frequency f of an electric signal applied from the frequency modulator 35 and the luminance B in the organic electroluminescent device 10 is previously found, and the results are stored as a table in a storage device or the like and are referred to as required.

As a more convenient method, it is possible to use a method in which an approximate expression of a function representing the relationship between the luminance B in the organic electroluminescent device 10 and the frequency f of an electric signal to be applied from the frequency modulator 35 is found, and the frequency f of the electric signal to be applied is determined from the approximate expression in correspondence to the luminance B found in the organic electroluminescent device 10.

Description is now made of an example of a method of determining the frequency f of an electric signal to be applied from an approximate expression.

The luminance in a case where the organic electroluminescent device 10 is caused to emit light most brightly is taken as the maximum luminance Bx, and the ratio B/Bx of the luminance B to the maximum luminance Bx is taken as the relative luminance d, as given by the following (expression 1):

$$d=(B/Bx) \qquad \text{(expression 1)}$$

d can take a value which is more than zero and not more than one, as given by the following (expression 2):

$$0<d\leq 1 \qquad \text{(expression 2)}$$

On the other hand, the luminance B in the organic electroluminescent device 10 and the frequency f are in the above-mentioned relationships as shown in FIGS. 3,5 and 7. In a frequency region in a predetermined range, that is, in a range of one kilohertz to several hundred kilohertz in the example as shown in the drawings, the relationship between the logarithm of the frequency f and the luminance B is indicated by a straight line with a negative slope, so that the logarithm $\log_x f$ of the frequency having an arbitrary positive real number x as its base and the luminance B can be approximated by a proportional relation.

In an arbitrary frequency range of fa to fb in a frequency region where the relationship between the logarithm of the frequency f and the luminance B is indicated by a straight line with a negative slope, the change in the luminance B with the change in the frequency f can be suitably controlled.

When $\log_x fa=La$ (expression 3), $\log_x fb=Lb$ (expression 4), and $\log_x f=L$ (expression 5), the luminance B in the organic electroluminescent device 10 is in a proportional relation with a negative slope to the value of $\log_x f$, whereby the following (expression 6) holds in an approximate manner:

$$d=(Lb-L)/(Lb-La) \qquad \text{(expression 6)}$$

d=1 in the (expression 6) in a case where f is fa, while d=0 in a case where f is fb.

Furthermore, when L is found in the (expression 6), L is expressed by the (expression 7);

$$L=Lb-d\cdot(Lb-La) \qquad \text{(expression 7)}$$

When the foregoing (expression 5) is substituted into the (expression 7), the following (expression 8) is obtained:

$$f_{=x}Lb-d\cdot(Lb-La) \qquad \text{(expression 8)}$$

When the above-mentioned values of La and Lb are respectively found from the frequencies fa and fb, and the relative value d is given, the frequency f corresponding to the luminance B can be found by the (expression 8), so that the frequency f of an electric signal outputted to each of the data lines 31 by the corresponding frequency modulator 35 can be controlled on the basis of the foregoing (expression 8).

The following (expression 9) to the following (expression 13) are derived on the basis of the foregoing (expression 3) to the following (expression 8):

$$L-Lb=-d\cdot(Lb-La) \qquad \text{(expression 9)}$$

$$\log_x(f/fb)=-d\cdot(Lb-La) \qquad \text{(expression 10)}$$

$$f/fb=x^{-d\cdot(Lb-La)} \qquad \text{(expression 11)}$$

$$f/fb=\{x^{(Lb-La)}\}^{-d} \qquad \text{(expression 12)}$$

$$f/fb=(fb/fa)^{-d} \qquad \text{(expression 13)}$$

The following (expression 14) is derived from the foregoing (expression 13):

$$f=fb\cdot(fb/fa)^{-d} \qquad \text{(expression 14)}$$

The (expression 14) is mathematically equivalent to the foregoing (expression 8), and can be similarly utilized. When the logarithm having 2 as its base of (fb/fa) is represented by a real number c, the following (expression 15) and the following (expression 16) hold:

$$\log_2(fb/fa)=c \qquad \text{(expression 15)}$$

$$(fb/fa)=2^c \qquad \text{(expression 16)}$$

When the (expression 16) is substituted into the (expression 14), the following (expression 17) and the following (expression 18) are derived:

$$f=fb\cdot(2^c)^{-d} \qquad \text{(expression 17)}$$

$$f=fb\cdot(2^{d\cdot c}) \qquad \text{(expression 18)}$$

The (expression 18) is mathematically equivalent to the (expression 8), and can be similarly utilized.

In gradually controlling the luminance in the organic electroluminescent device 10 at g gray levels, when the luminance in the organic electroluminescent device 10 is controlled at a gray level e between 1 and g, the above-mentioned relative luminance d is expressed by the following (expression 19). The above-mentioned values g and e shall be integers.

$$d=(e/g) \qquad \text{(expression 19)}$$

Since e is not more than g, the following (expression 20) holds:

$$(1/g)\leq d\leq 1 \qquad \text{(expression 20)}$$

When the foregoing (expression 19) is substituted into the (expression 18), the following (expression 21) is derived:

$$d=fb\cdot 2^{(-e\cdot c/g)} \qquad \text{(expression 21)}$$

In the case of the organic electroluminescent device 10, it is preferable that the value c is generally 7 to 8 from the relationships between the luminance and the frequency shown in FIGS. 3,5 and 7.

When the value c and the foregoing value g are the same, i.e., c=g, the foregoing (expression 21) can be expressed as the following (expression 22) upon being simplified:

$$f=fb\cdot(2^{-e}) \qquad \text{(expression 22)}$$

In this case, when the value e is one, the frequency f becomes its maximum value fb/2, so that the luminance in the organic electroluminescent device 10 becomes the lowest. On the other hand, when the value e becomes its maximum value g, the frequency f becomes its minimum value fb·(2−g), so that the luminance in the organic electroluminescent device 10 becomes the highest.

When the luminance in the organic electroluminescent device 10 is thus gradually controlled at g gray levels, a counter circuit and a frequency demultiplier can be used as the frequency modulator 35, so that the luminance in the organic electroluminescent device 10 can be controlled in a simple fashion.

A more specific example in which the display device according to the present embodiment is driven will be described on the basis of a block diagram of FIG. 10.

Figure 10:
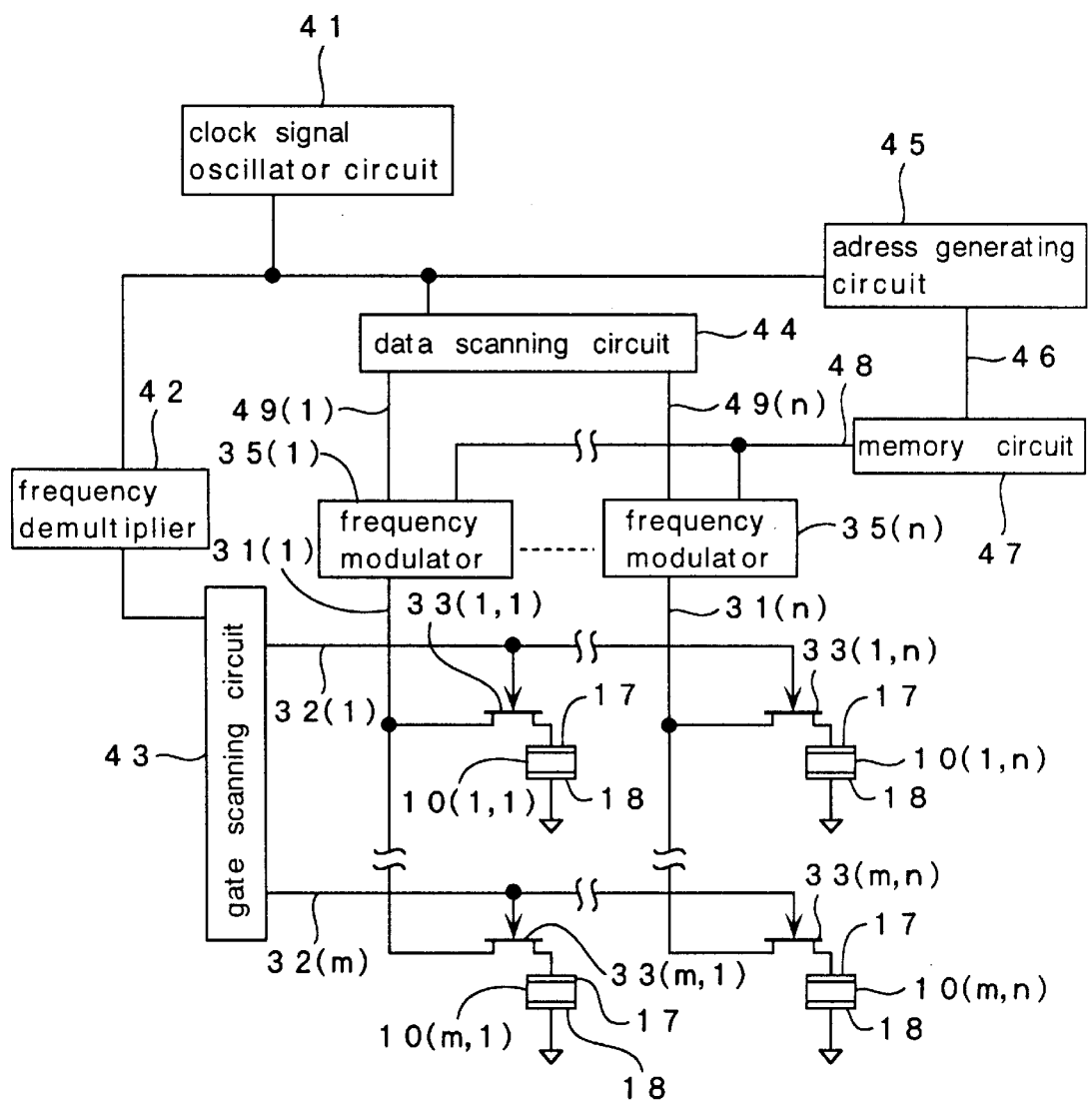
FIG. 10 is a block diagram showing one example in iwhich the display device according to the embodiment 3 is driven.

In the example shown in FIG. 10, a clock signal is produced in a clock signal oscillator circuit 41.

The clock signal is a pulse-shaped timing signal, and its clock frequency Fc is set on the basis of the number of columns n and the number of rows m of the organic electroluminescent devices 10 arranged in a matrix as described above, that is, the number n of the data lines 31, the number m of the scanning lines 32, and a scanning period Tf during which the scanning lines 32 in the first row to the m-th row are scanned upon being successively selected, that is, Fc=n·m/Tf. For example, in a case where n=128, m=64, and the scanning period Tf=33 msec as described above, the clock frequency Fc becomes 248242 Hz.

The clock signal branches into two clock signals, and one of the clock signals is inputted to the frequency demultiplier 42. In the frequency demultiplier 42, the clock signal is converted into a gate scanning signal after its frequency is so divided as to be 1/m times the clock frequency Fc. The gate scanning signal is inputted to a gate scanning circuit 43 from the frequency demultiplier 42.

The above-mentioned m scanning lines 32 are connected to the gate scanning circuit 43. When a pulse of the above-mentioned gate scanning signal is inputted, the gate scanning circuit 43 selects one predetermined scanning line 32(j) and makes the selected scanning line active. When a new subsequent pulse of the gate scanning signal is inputted to the gate scanning circuit 43, the gate scanning circuit 43 releases the selection of the scanning line 32(j) and makes the scanning line inactive, and selects the subsequent scanning line 32 (j+1) and makes the selected scanning line active.

After the scanning lines 32 in the first row to the m-th row are successively selected as described above by the gate scanning signal, the scanning line 32(1) in the first row is selected again and is made active. Such scanning is repeatedly performed.

On the other hand, the other clock signal obtained by the above-mentioned branching is inputted as a timing signal to a data scanning circuit 44 and an address generating circuit 45.

The address generating circuit 45 is connected to a memory circuit 47 by an address bus 46, and information representing the luminance corresponding to each of the organic electroluminescent devices 10 is stored in the memory circuit 47. Further, a data bus 48 is connected to the output side of the memory circuit 47, and the above-mentioned n frequency modulators 35 are connected in parallel to the data bus 48.

When the clock signal is inputted to the address generating circuit 45, a predetermined address value is outputted to the address bus 46 from the address generating circuit 45, and the address value is inputted to the memory circuit 47 through the address bus 46.

The information representing the luminance in the organic electroluminescent device 10 corresponding to the above-mentioned address value is outputted to the data bus 48 from the memory circuit 47.

When a new pulse of the clock signal is then inputted to the address generating circuit 45, an address value which is increased by one is outputted to the address bus 46 from the address generating circuit 45, so that the same operations are performed.

The address value outputted from the address generating circuit 45 takes n×m values corresponding to the organic luminescent devices 10 arranged in a matrix, so that the above-mentioned operations are repeatedly performed.

The address bus 46 can be constituted by digital signal lines. The number h of the digital signal lines constituting the address bus 46 is determined by the number of address values. In the case of the h digital signal lines, address values whose number corresponds to $2^h$ can be represented. In order to represent (n·m) address values, a minimum natural number satisfying $h \geq \log_2(n \cdot m)$ may be set as h. When n=128 and m=64 as described above, h may be not less than 13. The address bus 46 may be constructed using the 13 digital signal lines.

Furthermore, n signal enable lines 49 are connected to the output side of the data scanning circuit 44 to which the above-mentioned clock signal is inputted, and the n signal enable lines 49 are respectively connected to the corresponding n frequency modulators 35

When the clock signal is inputted to the data scanning circuit 44, the data scanning circuit 44 selects a predetermined signal enable line 49(i) out of the n signal enable lines 49 and makes the selected enable signal line active.

When the predetermined signal enable line 49(i) is thus made active, the predetermined frequency modulator 35(i) connected to the signal enable line 49(i) accepts information representing the luminance from the data bus 48. The frequency modulator 35(i) generates an electric signal having a frequency f corresponding to the luminance, and outputs the signal to the corresponding data line 31(i).

When a new subsequent pulse of the clock signal is inputted to the data scanning circuit 44, the signal enable line 49(i) is made inactive, and the adjacent subsequent signal enable line 49(i+1) is selected and is made active. The same operations as the above-mentioned operations are performed, after which the operations are repeatedly performed.

Output of the signal from the frequency modulator 35(i) to the data line 31(i) is held even if the signal enable line 49(i) enters an inactive state. When the signal enable line 49(i) is then made active, the frequency modulator 35(i) accepts information representing the luminance in the data bus 48 at that time, and changes the information into an electric signal having a frequency f corresponding to the luminance.

The data bus 48 can be constituted by digital signal lines. The number k of the digital signal lines constituting the data bus 48 is determined by the number of gray levels at which the luminance is represented. In the case of the k digital signal lines, representation at gray levels corresponding to $2^k$ can be achieved. In order to represent the luminance at g gray levels, a minimum natural number satisfying $k \geq \log_2(g)$ may be set as k. For example, in a case where the luminance is represented at 256 gray levels, k may be not less than eight. The data bus 48 may be constructed using the eight digital signal lines.

When the data bus 48 is constituted by the k digital signal lines, an oscillator or a counter circuit whose frequency f is controlled by a digital signal on the data bus 48 can be used as the above-mentioned frequency modulator 35.

Description is now made of a case where the frequency modulator 35 is simply constructed using a counter circuit or a frequency demultiplier as described above.

When c=g is set as described above in adjusting the frequency f in such a manner that the luminance in the organic electroluminescent device 10 is represented at a predetermined gray level, the frequency f is represented by f=fb·($2^{-e}$) as expressed by the foregoing (expression 22). In this case, when the value e is one, the frequency f becomes its maximum value fb/2, so that the luminance in the organic electroluminescent device 10 becomes the lowest. On the other hand, when the value e becomes its maximum value g, the frequency f becomes its minimum value fb·($2^{-g}$), so that the luminance in the organic electroluminescent device 10 becomes the highest.

Description is made by taking a case of c=g=8 as an example. The number k of digital signal lines constituting the data bus 48 is three, so that the data bus 48 can be constituted by the three digital signal lines. Although a digital signal in the data bus 48 is represented by binary notation, it is represented by an integer e between 1 and 8 upon being represented by decimal notation.

A high speed clock signal having a frequency of fb is generated by a high speed clock oscillator circuit (not shown). The high speed clock signal is inputted to the frequency modulator 35 using a counter circuit. The count number in the counter circuit is set to $2^e$. The above-mentioned high speed clock signal is so frequency-divided that the frequency is $2^{-e}$ times the original frequency, to output an electric signal having a frequency f to the data line 31.

In this case, the frequency f is controlled in the range of fb/256 to fb/2. When fb is 512 kHz, the frequency f is in the range of 2 kHz to 256 kHz. As shown in FIGS. 3, 5 and 7, in a frequency region where the relationship between the luminance in the organic electroluminescent device 10 and the logarithm of the frequency f is indicated by a straight line with a negative slope, the luminance in the organic electroluminescent device 10 is controlled by the frequency f.

When fb=Fc, the above-mentioned high speed clock oscillator circuit can be replaced with the above-mentioned clock signal oscillator circuit 41.

The data bus 48 can be also constituted by one analog signal line. At this time, information representing the luminance corresponding to the organic electroluminescent device 10 can be represented by the value of a voltage or a current applied to the analog signal line.

When the information representing the luminance is represented by the value of the voltage applied to the analog signal line, a voltage controlled oscillator (VCO) constructed in such a manner that a voltage of the data bus 48 is applied to a variable capacitance element whose capacitance varies depending on a voltage to be applied is used as the above-mentioned frequency modulator 35. For example, the voltage applied to the data bus 48 composed of the analog signal line is set to a plurality of voltage values corresponding to the number of gray levels in a range to +20 volts in which no burden is imposed on the VCO and other circuits, to feed the information representing the luminance.

An example in which in the display device according to the present embodiment, a switching element 33 composed of a thin film field effect transistor (TFT) using polycrystalline silicon, amorphous silicon or the like is provided in correspondence to the organic electroluminescent device 10 will be described on the basis of FIG. 11.

Figure 11:
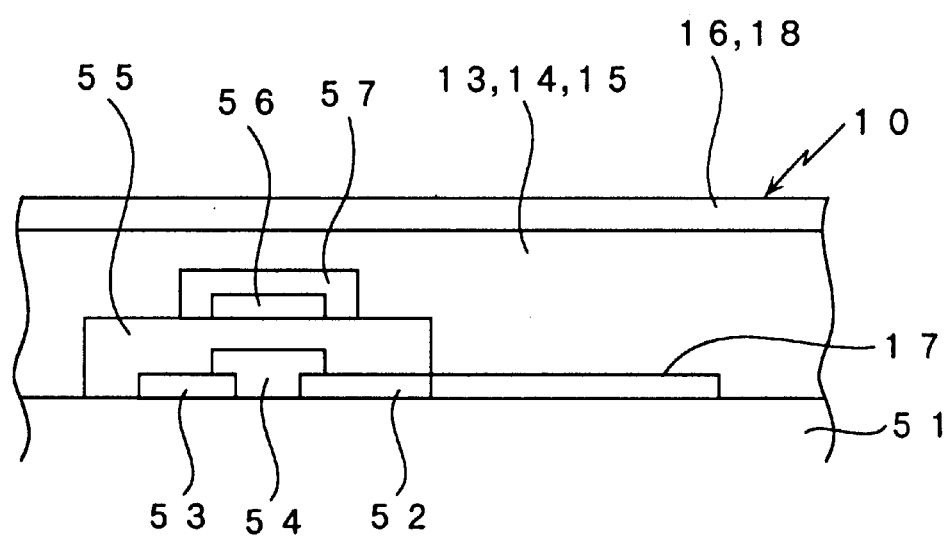
FIG. 11 is a schematic explanatory view showing an example in which a switching element using a thin film field effect transistor is provided in correspondence to an organic electroluminescent device in the display device according to the embodiment 3.

A transparent conductive film composed of ITO is first so formed that the thickens thereof is 100 nm (ranging from 100 nm to 1 μm) by sputtering on a glass substrate 51, and the transparent conductive film is patterned using photoresist and is etched using a hydrochloric acid solution containing $FeCl_3$ or the like, to integrally provide a source electrode 52 and a pixel electrode 17 in the organic electroluminescent device 10, as shown in FIG. 11, on the glass substrate 51, as well as to form a drain electrode 53 and a drain line (not shown) connected to the drain electrode 53. The pixel electrode 17 is used as a hole injection electrode 12 in the organic electroluminescent device 10, and the drain line is used as the data line 31.

In order to then form a channel portion of the TFT between the source electrode 52 and the drain electrode 53, an amorphous silicon film is so grown thereon by plasma CVD (Chemical Vapor Deposition) or the like that the thickness thereof is 250 nm (ranging from 200 nm to 300 nm) and is patterned, to form an island 54.

Furthermore, a resist film is so formed as to cover the pixel electrode 17, silicon dioxide $SiO_2$ is so formed as an insulating layer on the resist film, the source electrode 52, the drain electrode 53 and the island 54 that the thickness thereof is 400 nm, and the insulating layer on the pixel electrode 17 is removed by a liftoff method to expose the pixel electrode 17. On the other hand, a gate insulating layer 55 is so formed as to cover the source electrode 52, the drain electrode 53 and the island 54.

Aluminum is then used, which may contain molybdenum not more than 1% by weight of aluminum to form a gate electrode 56 having a thickness of 250 nm (ranging from 200 nm to 300 nm) in a portion above the island 54, as well as to form a gate line serving as the scanning line 32 so as to be connected to the gate electrode 56 by electron beam heated vacuum vapor deposition method, CVD or the like.

A gate protective insulating film 57 composed of silicon dioxide $SiO_2$ having a thickness of 300 nm (ranging from 200 to 400 nm) is then so formed as to cover the gate electrode 56. An amorphous silicon film constituting the island 54 may be modified to a polycrystalline silicon film upon being heat-treated by a method such as laser annealing.

After the switching element 33 using the TFT is thus formed on the glass substrate 51, the hole transporting layer 13, the luminescent layer 14 and the electron transporting layer 15 in the organic electroluminescent device 10 are formed on the glass substrate 51, and an electron injection electrode 16 composed of a material having a small ionization potential such as an alloy of magnesium and indium is provided thereon as the above-mentioned common electrode 18.

In arranging the above-mentioned pixel electrode 17 on the surface of the glass substrate 51, pixel electrodes 17 are so successively provided that a pitch therebetween is 98 μm, for example, and the area of each of the pixel electrodes 17 is set to 7.86×$10^{-5}$ $cm^2$.

It is preferable to use as the above-mentioned switching element 33 a switching element exhibiting good transfer characteristics in its on state in the range of the minimum frequency to the maximum frequency in a case where the frequency is modulated as described above, while having good cutoff characteristics in its off state.

Further, it is preferable that as the DC characteristics of the switching element 33, the value of a current flowing through the drain electrode 53 is not less than 60 μA in a case where the switching element 33 is turned on in such a manner that a potential at the source electrode 52 is 0 volt, a potential at the drain electrode 53 is +15 volts, and a potential at the gate electrode 56 is +15 volts. On the other hand, it is preferable that the value of a current flowing through the drain electrode 53 is not more than 5 pA in a case where the switching element 33 is turned off in such a manner that a potential at the source electrode 52 is 0 volt, a potential at the drain electrode 53 is +10 volts, and a potential at the gate electrode 56 is −6 volts. Further, it is preferable that as the switching characteristics of the switching element 33, a rising time period Tr (a time constant τ) at the time of switching from the off state to the on state is short, i.e., not more than 1/10 of the emission time Te.

(Embodiment 4)

Figure 12:
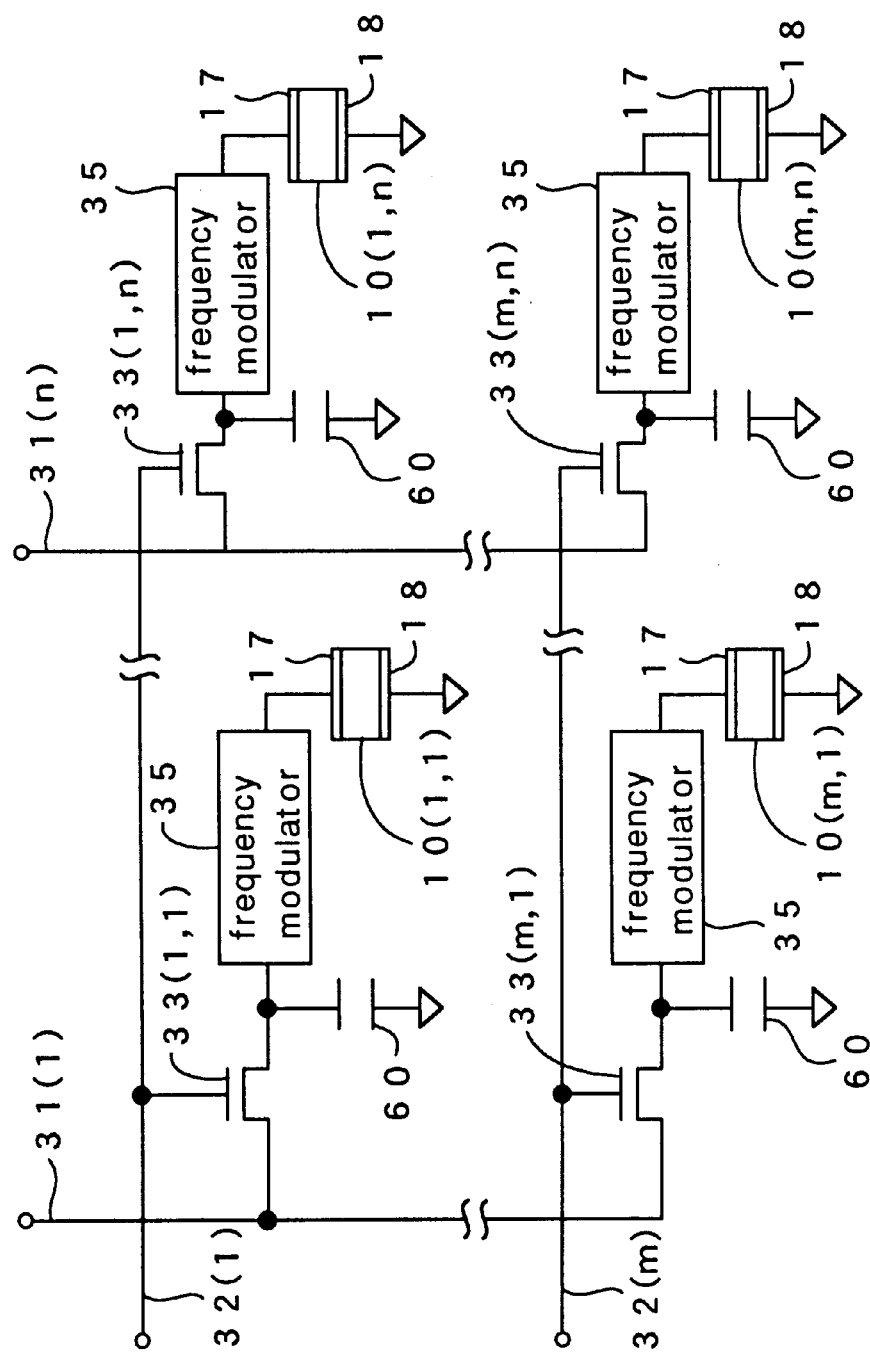
FIG. 12 is a schematic explanatory view of a display device according to an embodiment 4 utilizing the organic electroluminescent device driving method according to the embodiment of the present invention.

Also in a display device according to the present embodiment, electroluminescent devices 10 are arranged in a matrix with n columns and m rows, as shown in FIG. 12, as in the display device according to the embodiment 3 shown in FIG. 9.

Also in the display device according to the present embodiment, n data lines 31 for respectively feeding electric signals for driving the organic electroluminescent devices 10 arranged in a matrix with n columns and m rows are provided in correspondence of the columns of the organic electroluminescent devices 10, and m scanning lines 32 for respectively selecting pixels are provided in correspondence to the rows of the organic electroluminescent devices 10 in such a manner as to be perpendicular to the n data lines 31, as in the display device according to the embodiment 3 shown in FIG. 9. Switching elements 33 are respectively provided in correspondence to the organic electroluminescent devices 10 in intersections of the data lines 31 and the scanning lines 32. on the other hand, in the display device according to the present embodiment, there are provided between each of the switching elements 33 and the corresponding organic electroluminescent device 10 a capacitor 60 serving as storage means and a frequency modulator 35 for outputting an electric signal whose frequency is modulated to the organic electroluminescent device 10, as shown in FIG. 12. An analog voltage signal corresponding to the luminance in the organic electroluminescent device 10 which is held in the capacitor 60 is inputted to the frequency modulator 35.

A pixel electrode 17 in each of the organic electroluminescent devices 10 is connected to the output side of the frequency modulator 35. An electric signal whose frequency is modulated is outputted to the organic electroluminescent device 10 from the frequency modulator 35. The other electrodes in the organic electroluminescent devices 10 are a common electrode 18.

Also in the display device, in displaying an image, the scanning lines 32 in the first row to the m-th row are successively selected and are made active, and only the switching elements 33 connected to the rows of the scanning lines 32 which are selected and are made active are turned on, as in the above-mentioned display device according to the embodiment 3.

On the other hand, information each corresponding to the luminance in each of the organic electroluminescent devices 10 in the first column to the n-th column which are connected to the rows of the switching elements 33 thus turned on are respectively fed as analog voltage signals to the data lines 31 in then columns, and the capacitors 60 are respectively charged with the analog voltage signals through the data lines 31.

The analog voltage signals with which the capacitors 60 are thus charged are respectively inputted to the frequency modulators 35. The frequency modulators 35 respectively output electric signals whose frequencies are modulated to the organic electroluminescent devices 10 in corresponding to the analog voltage signals, to adjust the luminance in each of the organic electroluminescent devices 10 in the first column to the n-th column which are connected to the rows of the switching elements 33 turned on as described above.

In the display device according to the present embodiment, input impedance at an input terminal of each of the frequency modulators 35 is set to a significantly high value. Even if each of the switching elements 33 connected to the scanning line 32 is turned off upon selection of the subsequent scanning line 32, the voltage value of the analog voltage signal with which the corresponding capacitor 60 is charged is kept approximately constant, so that the analog voltage signal continues to be inputted to the frequency modulator 35. Each of the organic electroluminescent devices 10 continues to emit light with previously determined luminance until the scanning line 32 is then selected and is made active, and the subsequent analog voltage signal is fed to the corresponding capacitor 60 through the corresponding data line 31.

In the display device according to the present embodiment, therefore, each of the organic electroluminescent devices 10 emits light for a longer time than that in the above-mentioned display device according to the embodiment 3. Each of the organic electroluminescent devices 10 can be driven in a region at a low voltage where light emission efficiency is high by further lowering a voltage applied to the organic electroluminescent device 10. Therefore, smaller consumed power is sufficient, and an image which is bright and does not flicker can be further represented.

Although in the display device according to the present embodiment, the capacitor 60 is used as storage means storing the analog signal voltage corresponding to the luminance in each of the organic electroluminescent devices 10, another storage means can be naturally used. Also as data stored in the storage means, it is naturally possible to use data other than the analog signal voltage.

Although the present invention has been fully described by way of examples, it is to be noted that various changes and modification will be apparent to those skilled in the art.

Therefore, unless otherwise such changes and modifications depart from the scope of the present invention, they should be construed as being included therein.

What is claimed is:

1. An organic electroluminescent device driving method in which the organic electroluminescent device is caused to emit light upon supplying electricity between a hole injection electrode and an electron injection electrode in the organic electroluminescent device, comprising the step of:
   modulating a frequency of electricity supplied to the organic electroluminescent device to adjust a luminance of the light emitted from the organic electroluminescent device.

2. The organic electroluminescent device driving method according to claim 1, wherein
   the frequency of electricity supplied to the organic electroluminescent device is modulated in a range of 1 kHz to 300 kHz, to adjust the luminance of the light emitted from the organic electroluminescent device.

3. The method of claim 1, wherein a portion where the luminance of the light emitted from the organic electroluminescent device varies substantially linearly with respect to the logarithm of the frequency of electricity supplied to the electroluminescent device is used.

4. An organic electroluminescent device driving method in which the organic electroluminescent device is caused to emit light upon supplying electricity between a hole injection electrode and an electron injection electrode in the organic electroluminescent device, comprising the step of:
   modulating a frequency of electricity supplied to the organic electroluminescent device to adjust a luminance of the light emitted from the organic electroluminescent device,
   wherein, in modulating the frequency of electricity supplied to the organic electroluminescent device, the frequency is increased or decreased with an effective value of the current of electricity being constant.

5. An organic electroluminescent apparatus for causing an organic electroluminescent device to emit light upon supplying electricity between a hole injection electrode and an electron injection electrode in the organic electroluminescent device, comprising:

a frequency modulator for modulating the frequency of electricity to adjust a luminance of the light emitted from the organic electroluminescent device and for supplying electricity to the organic electroluminescent device.

6. The organic electroluminescent apparatus according to claim 5, wherein the frequency of electricity supplied to the organic electroluminescent device from said frequency modulator is modulated in a range of 1 kHz to 300 kHz.

7. An organic electroluminescent apparatus, for causing an organic electroluminescent device to emit light upon supplying electricity between a hole injection electrode and an electron injection electrode in the organic electroluminescent device, comprising:

a frequency modulator for modulating the frequency of electricity and for supplying electricity to the organic electroluminescent device, wherein, in modulating the frequency of electricity supplied to the organic electroluminescent device from said frequency modulator, the frequency is increased or decreased with an effective value of the current of electricity being constant.

8. A display device in which a plurality of organic electroluminescent devices are provided, comprising:

a frequency modulator for modulating the frequency of electricity to adjust a luminance of the light emitted from the plurality of organic electroluminescent devices and for supplying electricity to the plurality of organic electroluminescent devices.

9. The display device according to claim 8, wherein the frequency of electricity supplied to the plurality of organic electroluminescent devices from said frequency modulator is modulated in a range of 1 kHz to 300 kHz.

10. A display device in which a plurality of organic electroluminescent devices are provided, comprising:

a frequency modulator for modulating the frequency of electricity and for supplying electricity to the plurality of organic electroluminescent devices, wherein, in modulating the frequency of electricity supplied to the plurality of organic electroluminescent devices from said frequency modulator, the frequency is increased or decreased with an effective value of the current of electricity being constant.

11. A display device in which a plurality of organic electroluminescent devices are arranged in a matrix, comprising, for each of columns or rows of the plurality of organic electroluminescent devices arranged in a matrix:

frequency modulator for modulating the frequency of electricity to adjust a luminance of the light emitted from the plurality of organic electroluminescent devices and for supplying electricity to the plurality of organic electroluminescent devices.

12. The display device according to claim 11, wherein the frequency of electricity supplied to the plurality of organic electroluminescent devices by said frequency modulator is modulated in a range of 1 kHz to 300 kHz.

13. The display device according to claim 11, wherein the plurality of organic electroluminescent devices are respectively provided integrally with switching elements each composed of a thin film field effect transistor.

14. A display device in which a plurality of organic electroluminescent devices are arranged in a matrix, comprising, for each of columns or rows of the plurality of organic electroluminescent devices arranged in a matrix:

frequency modulator for modulating the frequency of electricity and for supplying electricity to the plurality of organic electroluminescent devices, wherein, in modulating the frequency of electricity supplied to the plurality of organic electroluminescent devices from said frequency modulator, the frequency is increased or decreased with an effective value of the current of electricity being constant.

15. A display device, in which a plurality of organic electroluminescent devices are arranged in a matrix, comprising, for each of columns or rows of the plurality of organic electroluminescent devices arranged in a matrix, frequency modulator for modulating the frequency of electricity and for supplying electricity to the plurality of organic electroluminescent devices, wherein said frequency modulator comprises at least one of, a counter circuit or a frequency demultiplier as said frequency modulator.

16. A display device in which a plurality of organic electroluminescent devices are arranged in a matrix, comprising, for each of the plurality of organic electroluminescent devices arranged in a matrix:

frequency modulator for modulating the frequency of electricity to adjust a luminance of the light emitted from the organic electroluminescent device and for supplying electricity to the organic electroluminescent device and storage device for storing data representing the frequency of supplied electricity.

17. The display device according to claim 16, wherein the frequency of electricity supplied to the plurality of organic electroluminescent devices by said frequency modulator is modulated in a range of 1 kHz to 300 kHz.

18. The display device according to claim 16, wherein said storage device comprises a capacitor.

19. The display device according to claim 16, wherein the plurality of organic electroluminescent devices are respectively provided integrally with switching elements, each composed of a thin film field effect transistor.

20. The display device in which a plurality of organic electroluminescent devices are arranged in a matrix, comprising, for each of the plurality of organic electroluminescent devices arranged in a matrix:

frequency modulator for modulating the frequency of electricity and for supplying electricity to the organic electroluminescent device and storage device for storing data representing the frequency of supplied electricity, wherein in modulating the frequency of electricity supplied to the plurality of organic electroluminescent devices from said frequency modulator, the frequency is increased or decreased with an effective value of the current of electricity being constant.

21. The display device in which a plurality of organic electroluminescent devices are arranged in a matrix, comprising, for each of the plurality of organic electroluminescent devices arranged in a matrix:

frequency modulator for modulating the frequency of electricity and for supplying electricity to the organic electroluminescent device and storage device for storing data representing the frequency of supplied electricity, wherein said frequency modulator comprises at least one of, a counter circuit and a frequency demultiplier.

* * * * *